(12) United States Patent
Hsieh et al.

(10) Patent No.: US 6,969,686 B2
(45) Date of Patent: Nov. 29, 2005

(54) MEMORY DEVICE HAVING ISOLATION TRENCHES WITH DIFFERENT DEPTHS AND THE METHOD FOR MAKING THE SAME

(75) Inventors: Wen-Kuei Hsieh, Hsinchu (TW); Chih-Mu Huang, Hsinchu (TW); James Juen Hsu, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 253 days.

(21) Appl. No.: 10/353,177

(22) Filed: Jan. 28, 2003

(65) Prior Publication Data

US 2004/0092115 A1    May 13, 2004

(30) Foreign Application Priority Data

Nov. 7, 2002    (TW) .............................. 91132748 A

(51) Int. Cl.$^7$ ......................................... H01L 21/302
(52) U.S. Cl. ..................... 438/723; 438/211
(58) Field of Search ................. 438/211, 257, 264, 438/706, 710, 719, 723, 700

(56) References Cited

U.S. PATENT DOCUMENTS

| | | | |
|---|---|---|---|
| 6,008,084 A * | 12/1999 | Sung | 438/241 |
| 6,436,751 B1 * | 8/2002 | Liou et al. | 438/211 |
| 6,624,022 B1 * | 9/2003 | Hurley et al. | 438/256 |
| 6,690,051 B2 * | 2/2004 | Hurley et al. | 257/296 |
| 6,720,214 B2 * | 4/2004 | Ono | 438/213 |

* cited by examiner

*Primary Examiner*—Kin-Chan Chen
(74) *Attorney, Agent, or Firm*—Jiang Chyun IP Office

(57) ABSTRACT

A method for manufacturing a memory device utilizes multi-etching processes to respectively construct isolation trenches in a memory substrate that has a memory array area and a peripheral circuit region, wherein the depth of the trenches in the peripheral circuit region is deeper into the memory substrate than the depth of the trenches in the memory array area. Therefore, possible current leakage caused from the high operating voltage is effectively mitigated, and the performance of the memory device is increased.

8 Claims, 11 Drawing Sheets

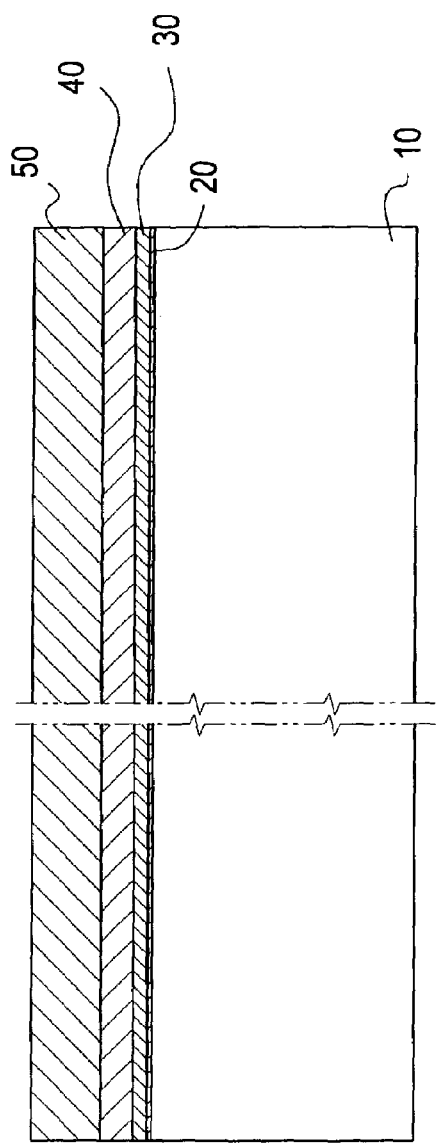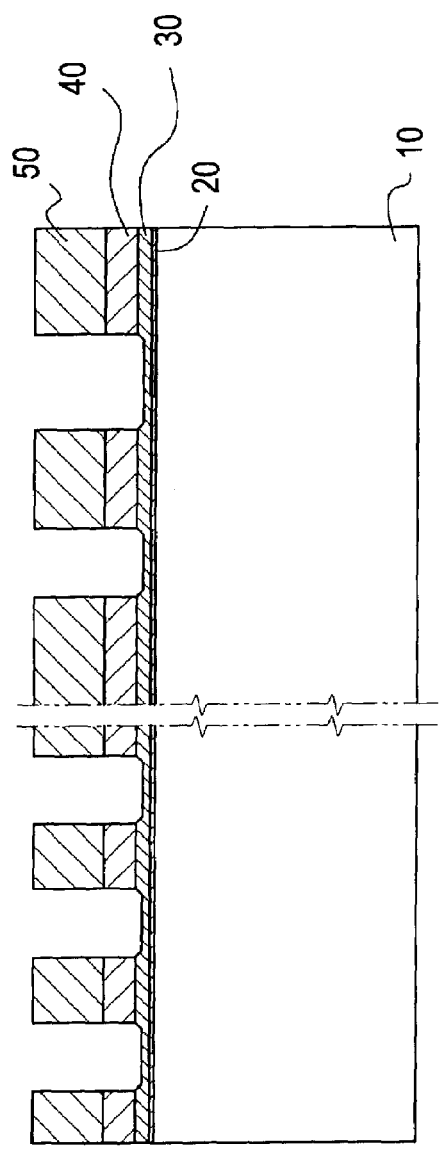

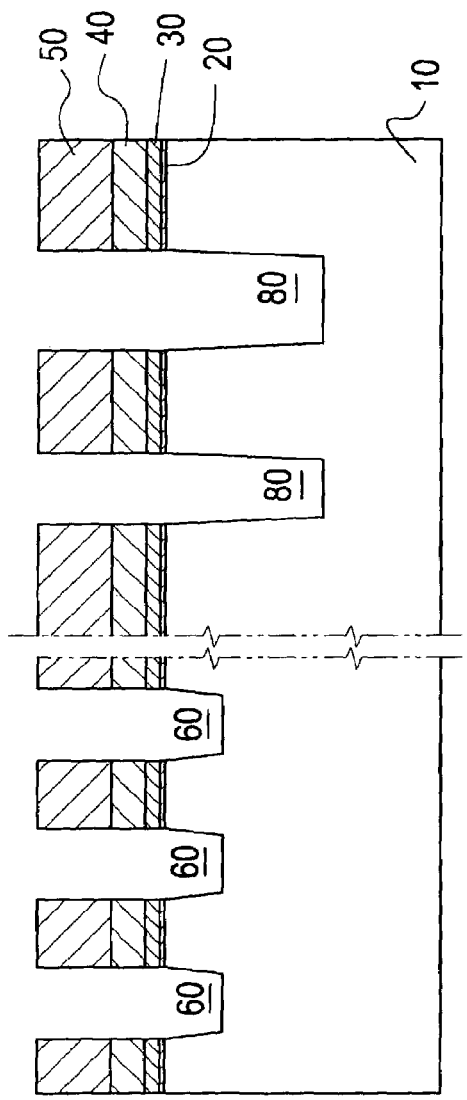
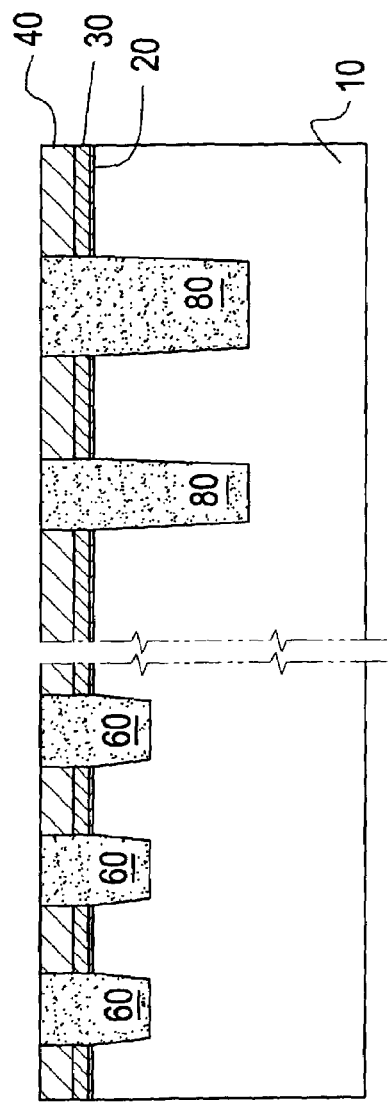

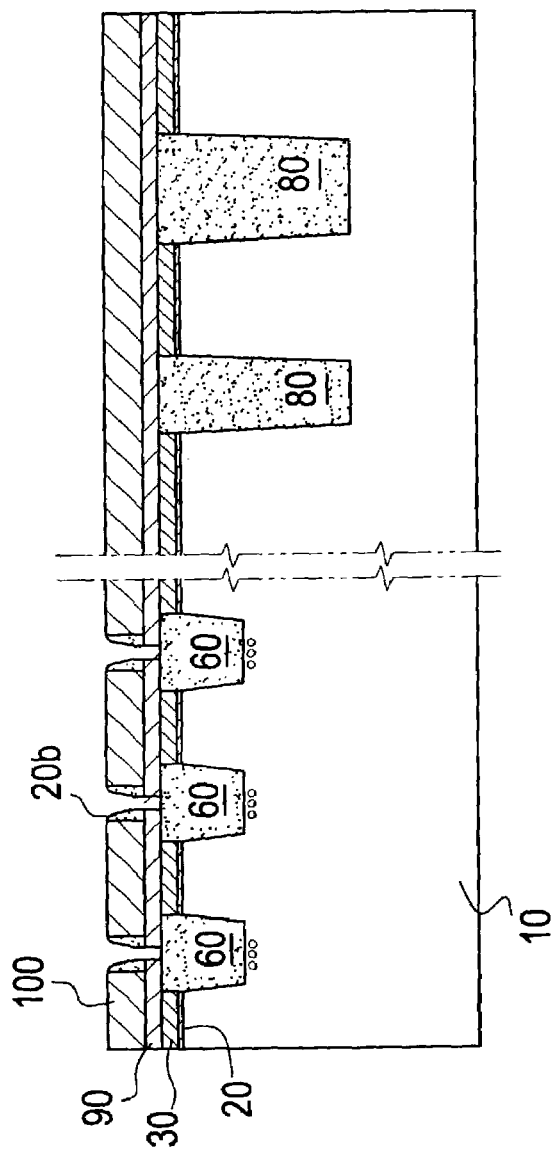
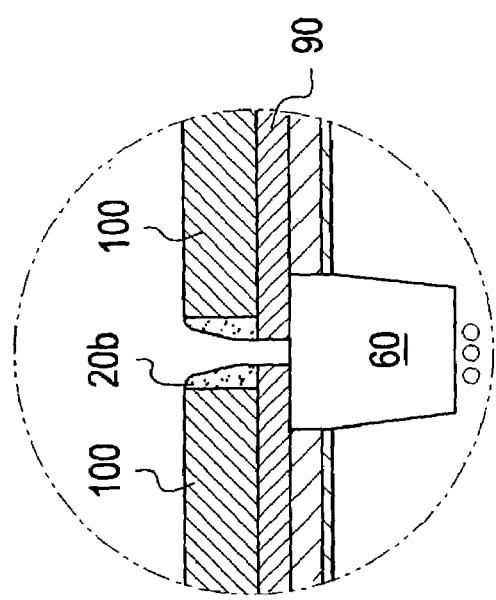

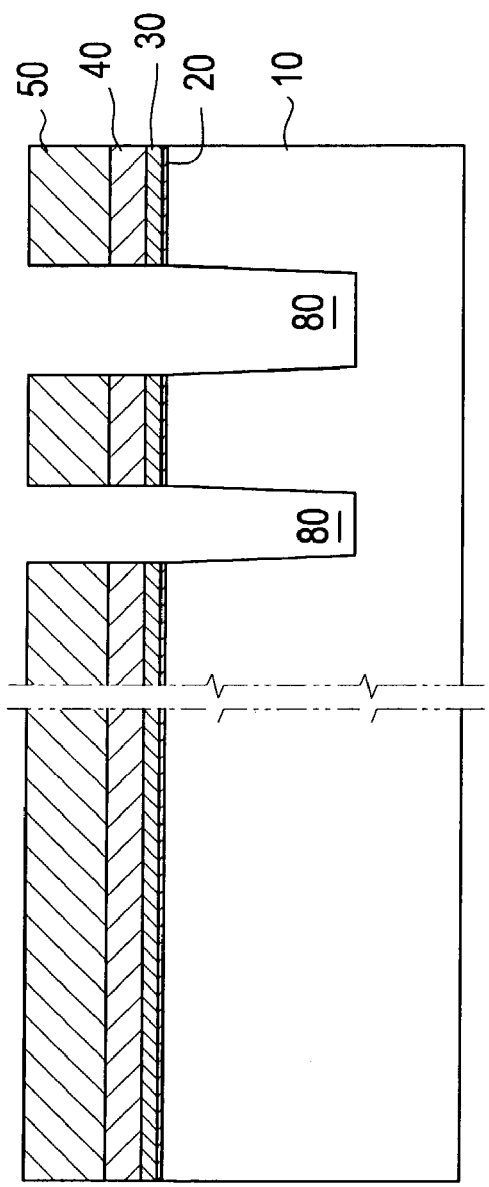
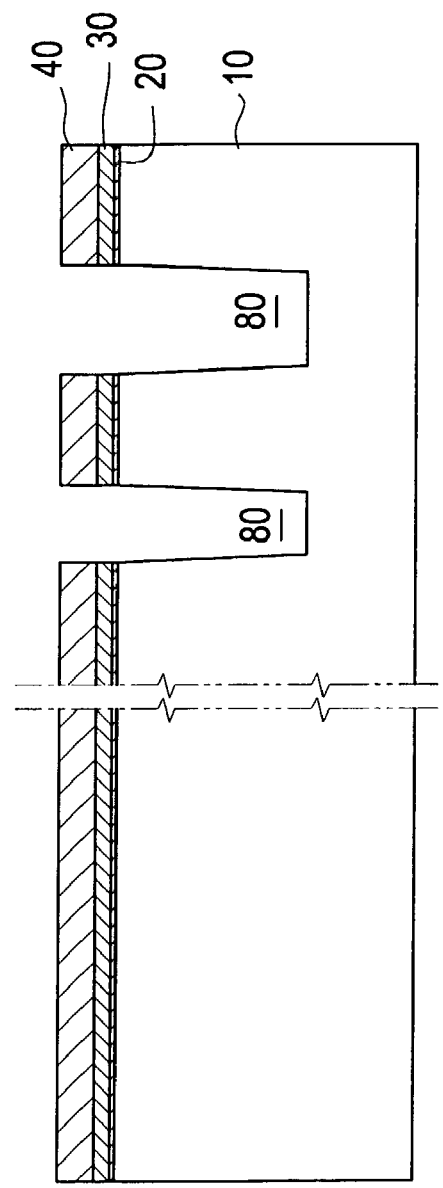
FIG.11
FIG.12

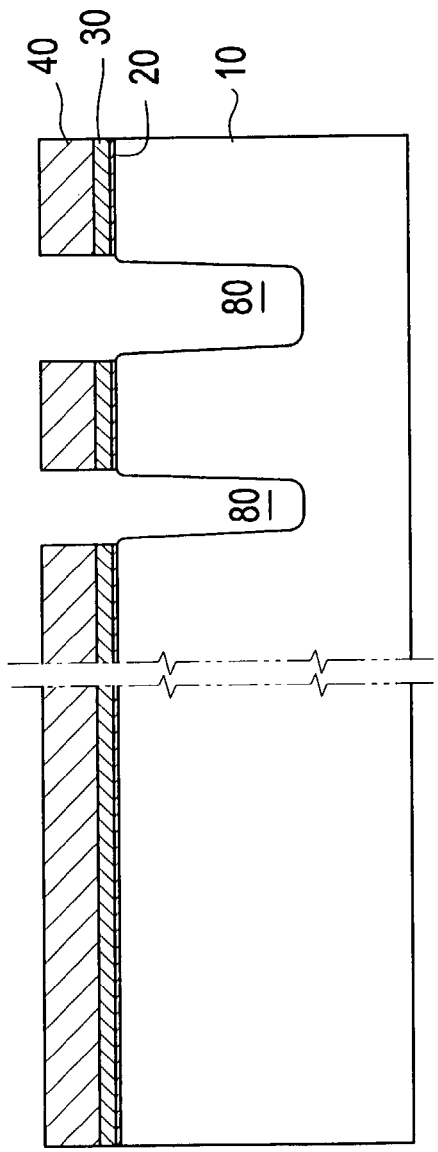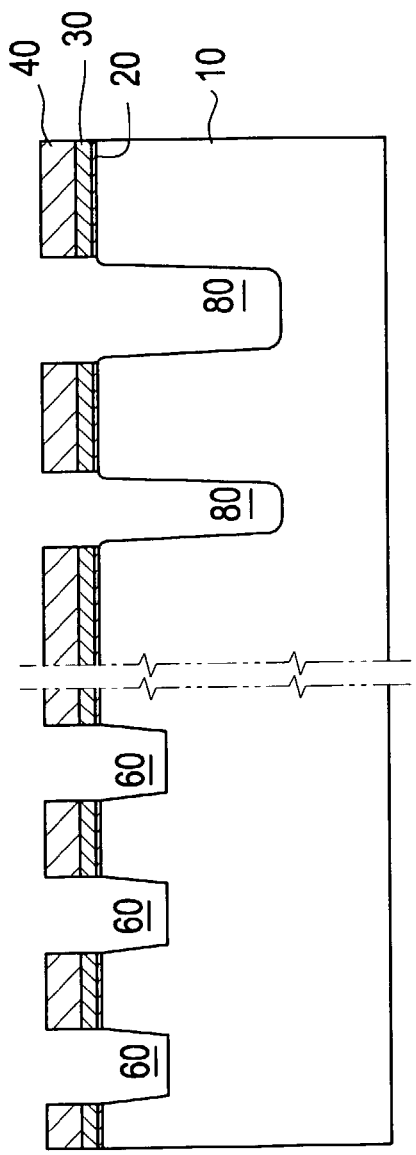

US 6,969,686 B2

MEMORY DEVICE HAVING ISOLATION TRENCHES WITH DIFFERENT DEPTHS AND THE METHOD FOR MAKING THE SAME

BACKGROUND OF THE INVENTION

1. Field of the Invention

The present invention relates to a memory device having isolation trenches with different depths and the method for making the same, and more particularly to a memory device that has isolation trenches formed in the peripheral circuit region that are deeper than those in the memory array area.

2. Description of Related Arts

In the present memory manufacturing processes, a shallow trench isolation technique has been widely applied. As an example, the flash memory mainly comprises two areas, a memory array area and a peripheral circuit region, wherein the former is for forming of memory cells, and the latter is for layout design of control circuits.

In the data accessing process of the flash memory, because the low operating voltage is unable to be applied for access of the flash memory, the operating voltage must be maintained at a high voltage level. Therefore, isolation trenches formed in the peripheral circuit region of the memory must have deeper depths to provide a superior isolation effect among the control circuits and to mitigate the problem of leaking current caused from the high operating voltage.

However, in the present memory fabricating process, the memory array area and the peripheral circuit region both utilize the same photo-mask to simultaneously define and form isolation trenches therein, whereby the isolation trenches in the two areas accordingly have the same depth. For the control circuits in the peripheral circuit region, the depth of the isolation trenches is unable to meet the isolation requirement and the leaking current caused by the high operating voltage still exist.

To overcome the mentioned shortcomings, a memory device having isolation trenches with different depths and the method for making the same in accordance with the present invention obviates or mitigates the aforementioned problems.

SUMMARY OF THE INVENTION

The main objective of the present invention is to provide a memory manufacturing method that effectively mitigates the leaking current in the peripheral circuit region and ensures that the memory is able to retain superior property even under high operating voltage.

To achieve the objective, the method in accordance with the present invention applies multi-time etching processes to respectively form isolation trenches in the memory array area and the peripheral circuit region with different depths, wherein the depth of the trenches in the peripheral circuit region is deeper than the depth of the trenches in the memory array area.

Said etching processes is mainly composed of two stages, wherein the first stage is to simultaneously etch the memory array area and the peripheral circuit region to form trenches with the same depth, whereafter in the second etching stage, the memory array area is coated with a photoresist layer and only the trenches in the peripheral circuit region are further etched to be deeper.

A further objective of the present invention is to provide a memory fabricating method that only alters the manufacture process in the peripheral circuit region without need to change any circuit layout in the memory array area, whereby the superior yield in the memory manufacture is still retained.

A further objective of the present invention is to provide a memory fabricating method that is particularly suitable for the flash memory since the flash memory needs high operating voltage to perform data accessing.

The features and structure of the present invention will be more clearly understood when taken in conjunction with the accompanying figures.

BRIEF DESCRIPTION OF THE DRAWINGS

FIGS. 1 to 8 are showing a first embodiment of a memory fabricating process in accordance of the present invention;

FIGS. 9 and 10A–10C are sequential views showing a second embodiment of a memory fabricating process in accordance of the present invention; and FIGS. 11 to 14 are sequential views showing a third embodiment of a memory fabricating process in accordance of the present invention.

DETAILED DESCRIPTION OF THE PREFERRED EMBODIMENT

Figure 3:
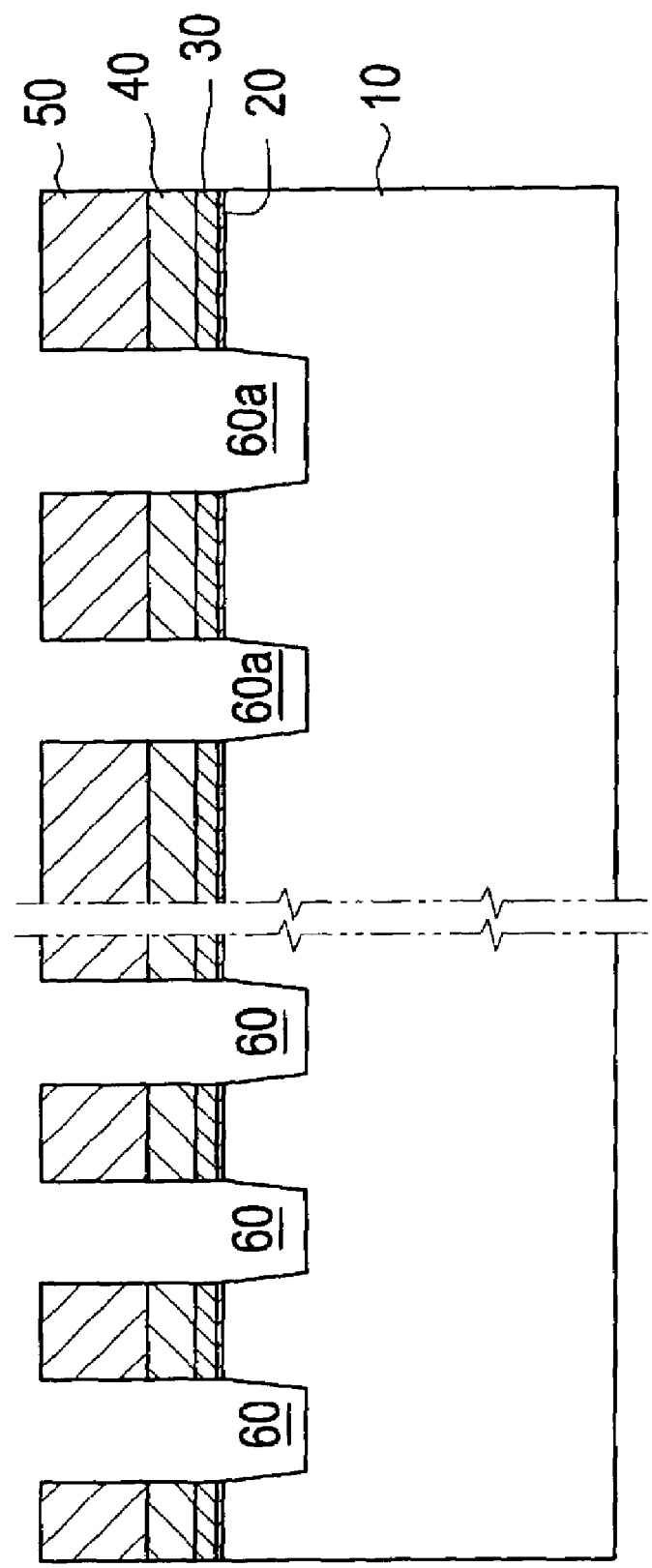

In FIGS. 1 to 8, a memory array area and a peripheral circuit region in a memory device are respectively and schematically illustrated at the left part and right part of the drawings.

With reference to FIG. 1, a tunnel oxide layer (20) (approximately 80–120 Å), a first gate layer (30) deposited by poly-silicon (approximately 400–1000 Å), a first silicon nitride (SiN) layer (40) (approximately 800–2000 Å) and a hard mask layer (50) composed of boron doped silicate glass (BSG) are sequentially formed on a silicon substrate (10).

With reference to FIG. 2, after the hard mask layer (50) is formed, a gate pattern defining process is applied on the memory array area and the peripheral circuit region to produce multiple gate electrodes. In detail, a photolithography operation is applied on the memory array area and the peripheral circuit region to have patterns of the gate electrodes, i.e. after a photoresist layer (not shown) is coated on the hard mask layer (50), the light exposing and pattern development steps etc. are sequentially performed, then portions of the SiN layer (40) and the hard mask layer (50) are etched and the first gate layer (30) is exposed. Because the memory cells in the memory array area are configured to have a high density arrangement, a deep ultraviolet mask (DUV Mask) is applied in the foregoing etching process.

With reference to FIG. 3, the remaining non-etched hard mask layer (50) is used as a passivation layer to prevent the SiN layer (40) from being etched, and the exposed portions of the first gate layer (30) in the memory array area and the peripheral circuit region are then etched, whereby the shallow trenches (60)(60*a*) are formed. The thickness of the etched substrate (10) is approximately in a range of 1500–3000 Å.

Figure 4:
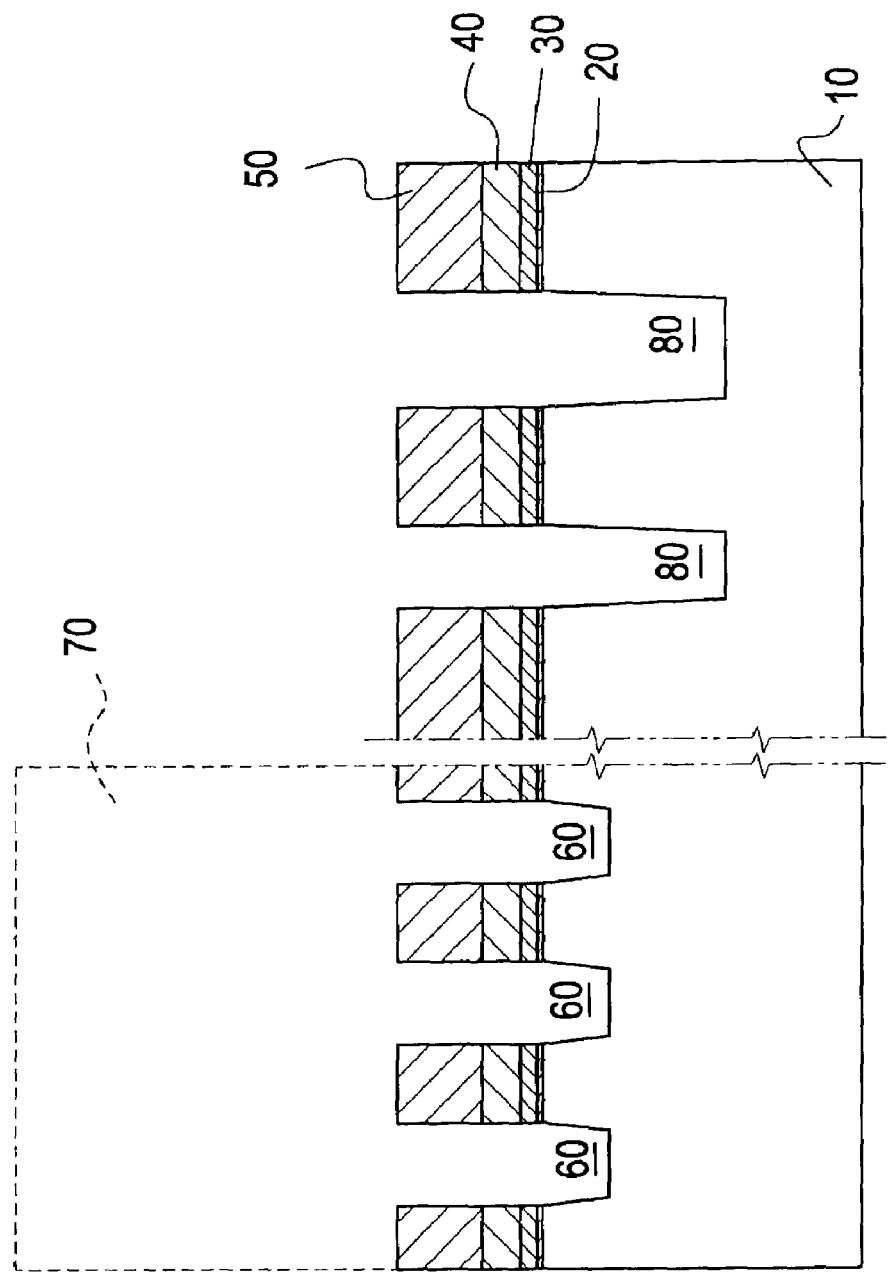

With reference to FIG. 4, through the use of another photo-mask, a photoresist layer (70) is provided only on the memory array area. The exposed shallow trenches (60*a*) in the peripheral circuit region are further etched downward again to become deep trenches (80), wherein the depth of the deep trenches (80) is about 3500–4500 Å. In this etching process, since the memory array area is covered with the photoresist layer (70) and the element patterns in the peripheral circuit region are arranged with low density, the photo-mask adopted in this etching process can be selected from a low cost mask, the middle ultraviolet mask (MUV mask). After the deep trenches (80) are formed, the photoresist layer (70) is then removed (as shown in FIG. 5).

With reference to FIG. 6, the remaining hard mask layer (50) in the memory array area and the peripheral circuit region is then removed. After which, high density plasma silicon oxide (HDP-SiO$_2$) is deposited on the memory array area and the peripheral circuit region to fill the shallow trenches (60) and the deep trenches (80). A polishing process, such as the chemical mechanical polish (CMP) is then provided on the two areas to obtain a flat and smooth surface of the first gate layer (30).

Figure 7:
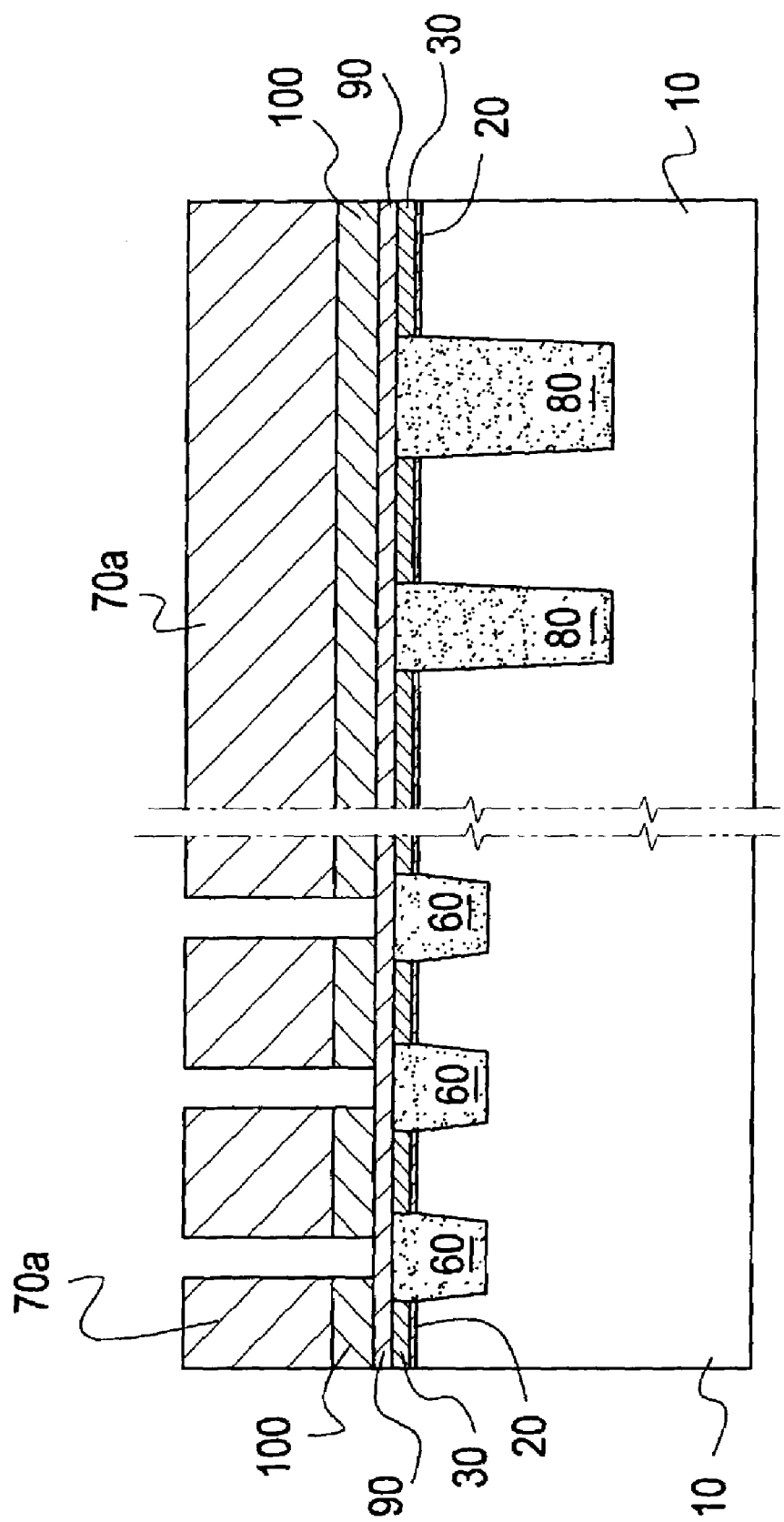

With reference to FIG. 7, the first SiN layer (40) together with the top portion of the deposited HDP-SiO$_2$ in the shallow trenches (60) and deep trenches (60) are removed. A second gate layer (90) composed of polysilicon and a second silicon nitride (SiN) layer (100) are deposited on the two areas. Then, a photolithography process cooperating with a photoresist layer (70a) are applied to define and etch the second SiN layer (100), wherein the defined pattern on the second SiN layer (100) is a gate pattern.

Figure 8:
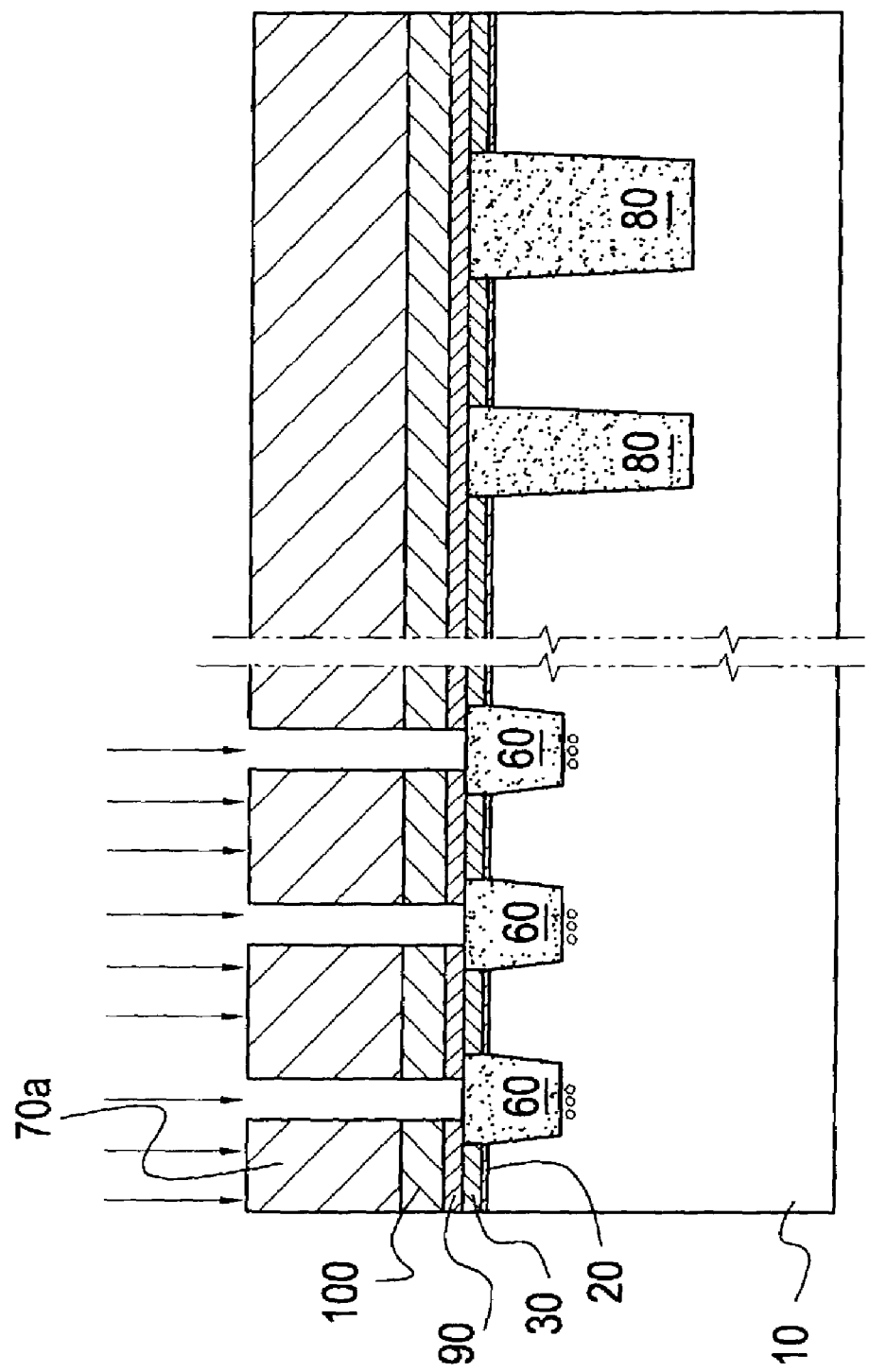
Figure 9:
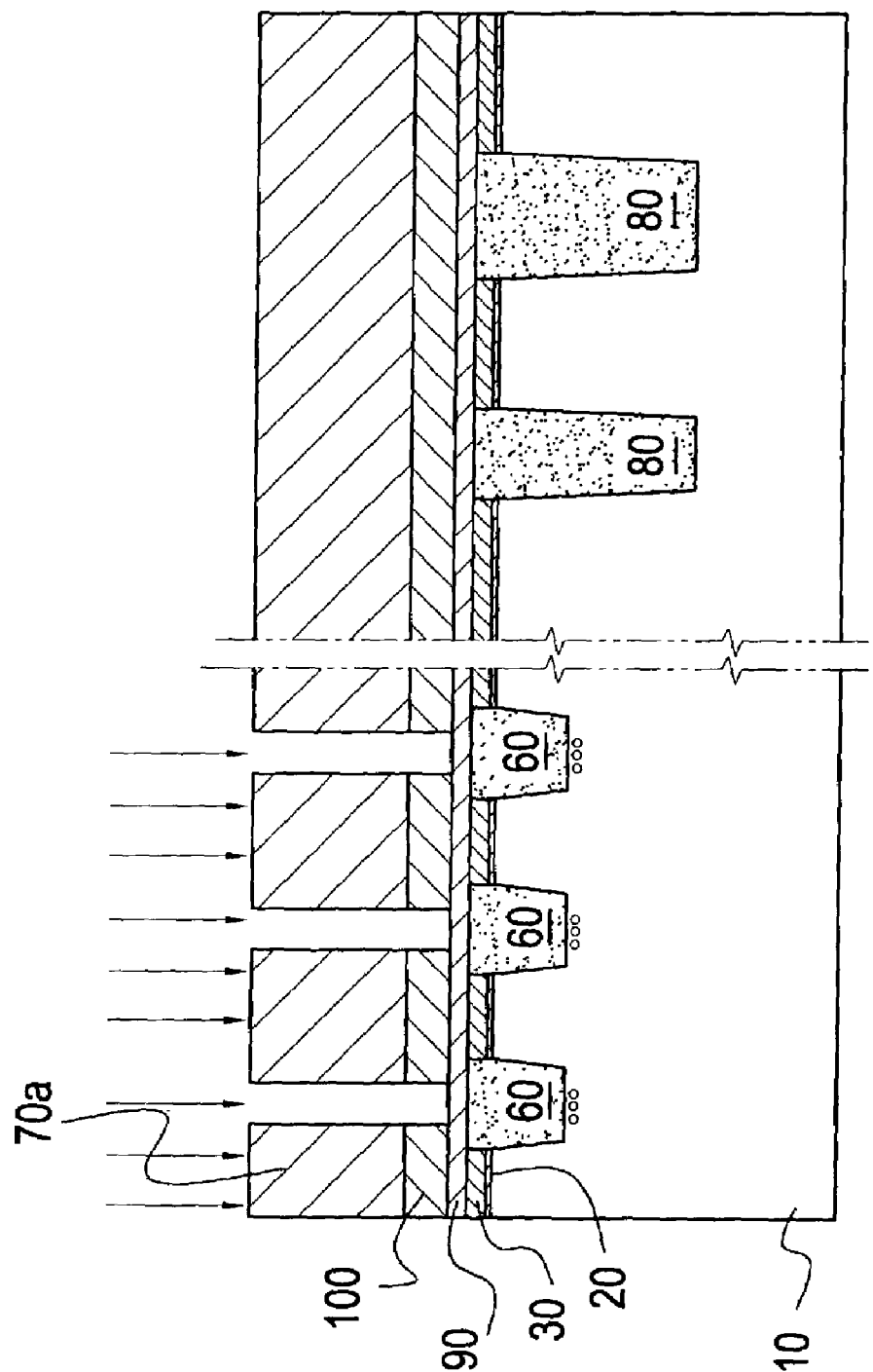

With reference to FIG. 8, the exposed portion of the second gate layer (90), which is not covered by the photoresist (70a), is etched and the surface of the shallow trenches (60) is revealed. An ion implant process is then applied on the memory array area to inject boron ions (represented with arrow symbols) into the substrate (10) beneath the shallow trenches (60). During the implant process, the photoresist (70a) is used as an isolating layer to limit the boron ions to only being injected into the exposed shallow trenches (60). Through the implant of the boron ions, the isolation efficiency between adjacent memory cells can be improved. After the boron ions are implanted, the photoresist layer (70a) is removed.

From the previous description, the first embodiment of the present invention forms shallow trenches (60) and deep trenches (80) respectively in the memory array area and the peripheral circuit region with different depths. In order to provide high isolation requirement when the peripheral circuit region is operated with high voltage, the deep trenches (80) formed in the peripheral circuit region further go deep into the substrate (80) for mitigating possible leaking of current. Moreover, when comparing the present invention with conventional processes, the present invention much more easily obtains the trenches with different depths simply by means of a low cost MUV mask.

Figure 10A:
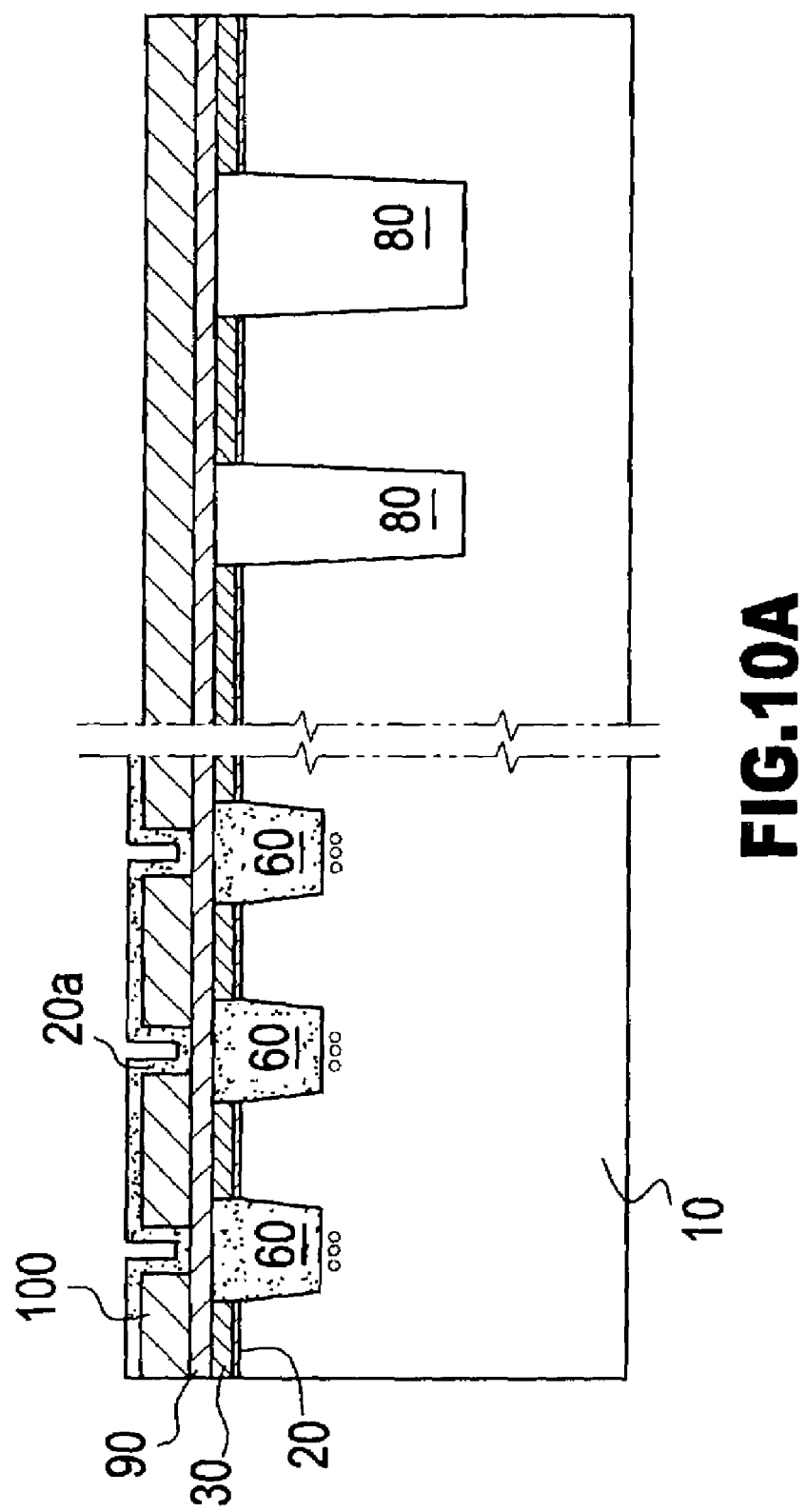

With reference to FIGS. 10A–10C, a second embodiment of the present invention is disclosed, wherein the memory device still has the different depths of trenches (60)(80) and a spacer is formed at side walls of each gate electrode to enhance the performance of the memory device.

Before the second gate layer (90) being etched, ions are injected into the substrate (10) and beneath the shallow trenches (60) through the second gate layer (90) by properly controlling the implant strength, whereafter the photo-resist (70a) is removed. A thin silicon nitride (SiN) layer (20a) is then coated on the memory array area (as shown in FIG. 10A), wherein an etching back process is applied to the thin SiN layer (20) to form spacers (20b) around the second SiN layer (100) (as shown in FIGS. 10B and 10C). Since the spacers (20b) are overlapped on portions of the second gate layer (90), the second gate layer (90) under the spacers (20b) is prevented from being etched. Therefore, the area of each individual gate electrode is accordingly increased so the coupling ratio is raised.

With reference to FIGS. 11 and 12, a third embodiment is similar to the first embodiment. In the peripheral circuit region, the photolithography process is firstly applied to form deep trenches (80), wherein the memory array area is covered with a photoresist layer (not shown) to prevent the memory array area from being etched so no trenches are formed. Thereafter, the hard mask layer (50) on the memory array area and the peripheral circuit region is removed (as shown in FIG. 12).

With reference to FIG. 13, a thin oxide layer (not shown) is further formed on the peripheral circuit region, and when the thin oxide layer is completely etched, the bottom of the deep trenches (80) and the periphery of the opening of the deep trenches (80) are slightly rounded. The rounding process is helpful to improve the depositing efficiency when filling the deep trenches (80) with the HDP-SiO$_2$.

With reference to FIG. 14, when the deep trenches (80) are formed in the peripheral circuit region, a photoresist layer (not shown) is provided on the memory array area and the peripheral circuit region. After the element pattern of the memory array area is defined, portions of the phototresist layer on the memory array area are removed, thus portions of the first SiN layer (40), the first gate layer (30), the tunnel. oxide layer (20) and the substrate (20) are able to be etched to form shallow trenches (60). Thereby, the memory device obtains shallow trenches (60) and deep trenches (80) respectively in the memory array area and the peripheral circuit region to provide different extents of the isolation effect.

After the shallow trenches (60) and the deep trenches (80) are formed, the HDP-SiO$_2$ is also deposited to fill each trench (60)(80), and then a polishing process, such as the chemical mechanical polish (CMP) is applied on the two areas to obtain a flat and smooth plane.

The advantages of the third embodiment is that when just two main photolithography processes are applied, the shallow trenches (60) and the deep trenches (80) can be sequentially obtained. Moreover, as the bottom of the trenches (80) and the periphery of the opening of the trenches (80) are rounded, the deposition effect of the HDP-SiO$_2$ in the trenches (80) is able to be improved. Further, since the SiN layer (40), not the hard mask layer (50), is used as the etching mask when forming the shallow trenches (60), the over-etching problem of the tunnel oxide layer (20) is avoided when removing the hard mask layer (50).

In conclusion, whatever embodiment mentioned foregoing, the shallow and deep trenches are constructed in the memory array area and the peripheral circuit region respectively in the memory device. Particularly, the deep trenches built in the peripheral circuit region are suitable to provide excellent isolation effect for mitigation of the current leakage that may be caused by high operating voltage.

The foregoing description of the preferred embodiments of the present invention is intended to be illustrative only and, under no circumstances, should the scope of the present invention be restricted by the description of the specific embodiment.

What is claimed is:

1. A method for manufacturing memory device having trenches with different depth, the method comprising:
    preparing a substrate defined with a memory array area and a peripheral circuit region;
    etching the memory array area and the peripheral circuit region respectively to form a first plurality of trenches in the memory array area and a second plurality of trenches in the peripheral circuit region, wherein the second plurality of trenches is formed being deeper into the substrate than the first plurality of trenches;
    filling the first plurality of trenches and the second plurality of trenches with a dielectric material to form a plurality of shallow trench isolations and a plurality of deep trench isolations respectively;

forming a plurality of gate structures over a substrate to expose the top of the shallow trench isolations; and implanting ions into the substrate and beneath each shallow trench isolation in the memory array area.

2. The method as claimed in claim 1, wherein the substrate has a tunnel oxide layer, a first gate layer, a first silicon nitride (SiN) layer and a hard mask layer sequentially formed thereon, wherein the memory array area and the peripheral circuit region etching step further comprises:

defining gate patterns on the memory array area and the peripheral circuit region to have multiple gate electrodes;

etching the memory array area and the peripheral circuit region based on the defined gate patterns simultaneously, whereby the first and the second plurality of trenches are formed into the substrate in the memory array area and the peripheral circuit region, respectively, wherein the first plurality of trenches is shallow trenches; and etching the second plurality of trenches in the peripheral circuit region, whereby the second plurality of trenches is formed being deeper into the substrate than the first plurality trenches, wherein the second plurality of trenches is deep trenches.

3. The method as claimed in claim 2, wherein a MUV mask is adopted in the gate patterns defining step and a DUV mask is adopted in the etching step of the second plurality of trenches.

4. The method as claimed in claim 2, wherein the step of filling the first plurality of trenches and the second plurality of trenches comprises:

removing the hard mask layer on the substrate after the shallow trenches and the deep trenches are formed;

depositing high density plasma silicon oxide (HDP-SiO$_2$) on the memory array area and the peripheral circuit region to fill the shallow trenches and the deep trenches; and removing and planishing the first SiN layer to obtain a flat plane on the first gate layer.

5. The method as claimed in claim 4, wherein the step of forming the gate structures comprises:

depositing a second gate layer on the first gate layer;

depositing a second silicon nitride (SiN) layer on the second gate layer;

defining gate patterns on the second SiN layer in the memory array area and etching the second SiN layer and the second gate layer in the memory array area to expose the top of the shallow trench isolations.

6. The method as claimed in claim 4, wherein the step of forming the gate structures and the step of implanting ions comprise:

depositing a second gate layer on the first gate layer;

depositing a second silicon nitride (SiN) layer on the second gate layer;

defining and etching the second SiN layer in the memory array area to correspond to the gate electrode patterns of the first gate layer;

implanting the ions through the second gate layer into the substrate and beneath each shallow trench isolation in the memory array area;

forming a thin oxide layer on the memory array area; and etching back the oxide layer, whereby spacers are formed at side walls of each gate electrode.

7. The method as claimed in claim 1, wherein the substrate has a tunnel oxide layer, a first gate layer, a first silicon nitride (SiN) layer and a hard mask layer sequentially formed thereon, wherein the memory array area and the peripheral circuit region etching step further comprises:

defining gate patterns on the peripheral circuit region to have multiple gate electrodes;

etching the peripheral circuit region based on the defined gate patterns, whereby the second plurality of trenches is formed into the substrate in the peripheral circuit region;

removing the hard mask layer;

defining gate patterns on the memory array area to have multiple gate electrodes; and etching the memory array area based on the defined gate patterns, whereby the first plurality of trenches is formed into the substrate in the memory array area, wherein the second plurality of trenches in the peripheral circuit region is formed being deeper into the substrate than the first plurality trenches in the memory array area.

8. The method as claimed in claim 7, before the gate pattern defining step of the memory array area further comprising:

forming a thin oxide layer on the peripheral circuit region; and etching the thin oxide layer to round a bottom and a periphery of the opening of the second plurality of trenches.

\* \* \* \* \*